US007435629B2

(12) United States Patent
Youn

(10) Patent No.: US 7,435,629 B2
(45) Date of Patent: Oct. 14, 2008

(54) THIN FILM TRANSISTOR ARRAY PANEL AND A MANUFACTURING METHOD THEREOF

(75) Inventor: Joo-Ae Youn, Seongnam-si (KR)

(73) Assignee: Samsung Electronics Co., Ltd., Suwon-Si (KR)

(*) Notice: Subject to any disclaimer, the term of this patent is extended or adjusted under 35 U.S.C. 154(b) by 124 days.

(21) Appl. No.: 11/207,522

(22) Filed: Aug. 19, 2005

(65) Prior Publication Data
US 2006/0038178 A1 Feb. 23, 2006

(30) Foreign Application Priority Data
Aug. 19, 2004 (KR) .................. 10-2004-0065391

(51) Int. Cl.
H01L 21/00 (2006.01)
H01L 21/84 (2006.01)
(52) U.S. Cl. ..................... 438/149; 257/59; 257/72
(58) Field of Classification Search ............ 257/59, 257/72; 438/149
See application file for complete search history.

(56) References Cited

U.S. PATENT DOCUMENTS

| 2001/0046016 A1* | 11/2001 | Park et al. ............. 349/139 |
| 2004/0041149 A1* | 3/2004 | Baek et al. ............. 257/49 |
| 2004/0056251 A1* | 3/2004 | Kim et al. ............. 257/72 |
| 2004/0099865 A1* | 5/2004 | Tak et al. ............. 257/72 |
| 2004/0183955 A1* | 9/2004 | Souk et al. ............. 349/43 |
| 2004/0195573 A1* | 10/2004 | Kim ............. 257/72 |
| 2005/0030440 A1* | 2/2005 | Lee et al. ............. 349/43 |

FOREIGN PATENT DOCUMENTS

CN 1517771 8/2004

* cited by examiner

Primary Examiner—Jerome Jackson
Assistant Examiner—Anthony Ho
(74) Attorney, Agent, or Firm—F. Chau & Associates, LLC

(57) ABSTRACT

A method of manufacturing a thin film transistor array panel and a thin film transistor array panel are provided. The method includes: forming a gate line and a storage electrode line on a substrate; forming a gate insulating layer on the gate line and the storage electrode line; forming a semiconductor layer on the gate insulating layer; forming a data line and a drain electrode on the semiconductor layer; depositing a passivation layer on the data line and the drain electrode; forming a photoresist including a first portion and a second portion on the passivation layer; etching the passivation layer using the photoresist to expose a portion of the data line and a first portion of the gate insulating layer; removing the second portion of the photoresist; etching the passivation layer and the first portion of the gate insulating layer using the photoresist to expose a second portion of the gate insulating layer and a portion of the drain electrode and a portion of the gate line; depositing a conductive film on the first transformed photoresist; and removing the first transformed photoresist to form a pixel electrode connected to the exposed portion of the drain electrode.

11 Claims, 13 Drawing Sheets

THIN FILM TRANSISTOR ARRAY PANEL AND A MANUFACTURING METHOD THEREOF

CROSS-REFERENCE TO RELATED APPLICATION

This application claims priority to Korean Patent Application No. 10-2004-0065391, filed on Aug. 19, 2004, the disclosure of which is incorporated herein by reference in its entirety.

BACKGROUND OF THE INVENTION

1. Technical Field

The present invention relates to a thin film transistor array panel and a manufacturing method thereof.

2. Discussion of the Related Art

An active-type display device such as a liquid crystal display (LCD) or an organic light emitting display (OLED) includes a plurality of pixels arranged in a matrix, field-generating electrodes and switching elements. The switching elements include thin film transistors (TFTs) having three terminals, for example: a gate, a source, and a drain. The TFT of each pixel of the plurality of pixels selectively transmits data signals to one of the field-generating electrodes in response to gate signals.

The active-type display device further includes a plurality of signal lines for transmitting signals to the switching elements, which include gate lines for transmitting gate signals and data lines for transmitting data signals.

The LCD and the OLED active-type display devices each include a panel provided with the TFTs, the field-generating electrodes, and the signal lines. This configuration is referred to as a TFT array panel.

The TFT array panel has a layered structure and includes several conductive and insulating layers. The gate lines, the data lines, and the field-generating electrodes are each formed on different conductive layers of the TFT array panel and are separated by insulating layers.

The TFT array panel having such a layered structure is manufactured by performing several lithography steps followed by a series of etching steps. Because the lithography steps take up a large amount of time, the manufacturing costs of a layered TFT array panel tend to be high. Thus, a need exists for a technique of manufacturing a layered TFT array panel using a smaller number of lithography steps for reducing the manufacturing time and costs associated therewith.

SUMMARY OF THE INVENTION

A method of manufacturing a thin film transistor array panel and a thin film transistor array panel are provided.

The method includes: forming a gate line and a storage electrode line on a substrate; forming a gate insulating layer on the gate line and the storage electrode line; forming a semiconductor layer on the gate insulating layer; forming an ohmic contact layer on the semiconductor layer; forming a data line and a drain electrode on the ohmic contact layer; depositing a passivation layer on the data line and the drain electrode; forming a first photoresist including a first portion and a second portion that is thinner than the first portion on the passivation layer; etching the passivation layer using the first photoresist as a mask to expose a portion of the data line and a first portion of the gate insulating layer; removing the second portion of the first photoresist to transform the photoresist; etching the passivation layer and the first portion of the gate insulating layer using the first transformed photoresist as a mask to expose a second portion of the gate insulating layer and a portion of the drain electrode at least in part and to expose a portion of the gate line; depositing a conductive film on the first transformed photoresist; and removing the first transformed photoresist to form a pixel electrode connected to the exposed portion of the drain electrode.

The exposed portion of the data line and the exposed first portion of the gate insulating layer may reduce the thickness of the first portion of the gate insulating layer.

The first photoresist may be formed by using a photomask including a light blocking area, a translucent area, and a light transmitting area.

The removal of the second portion of the photoresist may be done by performing an ashing process. The ashing process may be performed to remove areas of the first photoresist corresponding to the translucent area of the photomask.

The conductive film formed on the first transformed photoresist may be removed along with the removal of the first transformed photoresist. The pixel electrode may border the gate insulating layer.

The formation of the pixel electrode may include forming contact assistants on the exposed gate line and the exposed data lines.

The formation of the semiconductor layer and the formation of the data line and the drain line may include: depositing in sequence the gate insulating layer, an intrinsic a-Si layer, an extrinsic a-Si layer, and a conductive layer; forming a second photoresist on the conductive layer having a different thickness in accordance with positions of the conductive layer; and selectively etching the conductive layer, the extrinsic a-Si layer, and the intrinsic a-Si using the second photoresist as a mask to form the data line, the drain electrode, and the ohmic contact layer.

The second photoresist may be formed by using a photomask including a light blocking area, a translucent area, and a light transmitting area. The method further includes forming a storage capacitor between the storage electrode line and the pixel electrode.

The thin film transistor array panel includes: a gate line and a storage electrode line formed on a substrate; a gate insulating layer formed on the gate line and the storage electrode line; a semiconductor layer formed on the gate insulating layer; a data line and a drain electrode formed on the semiconductor layer; a passivation layer formed on the data line and a first portion of the drain electrode; and a pixel electrode formed on the gate insulating layer and a second portion of the drain electrode and separated from the passivation layer, wherein the pixel electrode has a border substantially equal to that of the passivation layer.

The passivation layer and the gate insulating layer may have contact holes exposing a portion of the gate line and a portion of the data line. The panel may further include contact assistants formed in the contact holes, wherein the contact assistants have borders substantially equal to those of the contact holes.

The second portion of the drain electrode may overlap the storage electrode line. The second portion of the drain electrode may have a wider width than the remaining drain electrode, and a portion of the storage electrode line which may be overlapped with the drain electrode has a wider width than the remaining storage electrode line.

The semiconductor layer may have substantially the same planar shape as the data line and the drain electrode except at a portion disposed between the data line and the drain electrode.

The thin film transistor array panel may be used in an LCD or an OLED. The panel may further include a storage electrode formed between the storage electrode line and the pixel electrode.

BRIEF DESCRIPTION OF THE DRAWINGS

The present invention will become more apparent by describing in detail exemplary embodiments thereof with reference to the accompanying drawings, in which.

DETAILED DESCRIPTION OF EXEMPLARY EMBODIMENTS

Figure 1:
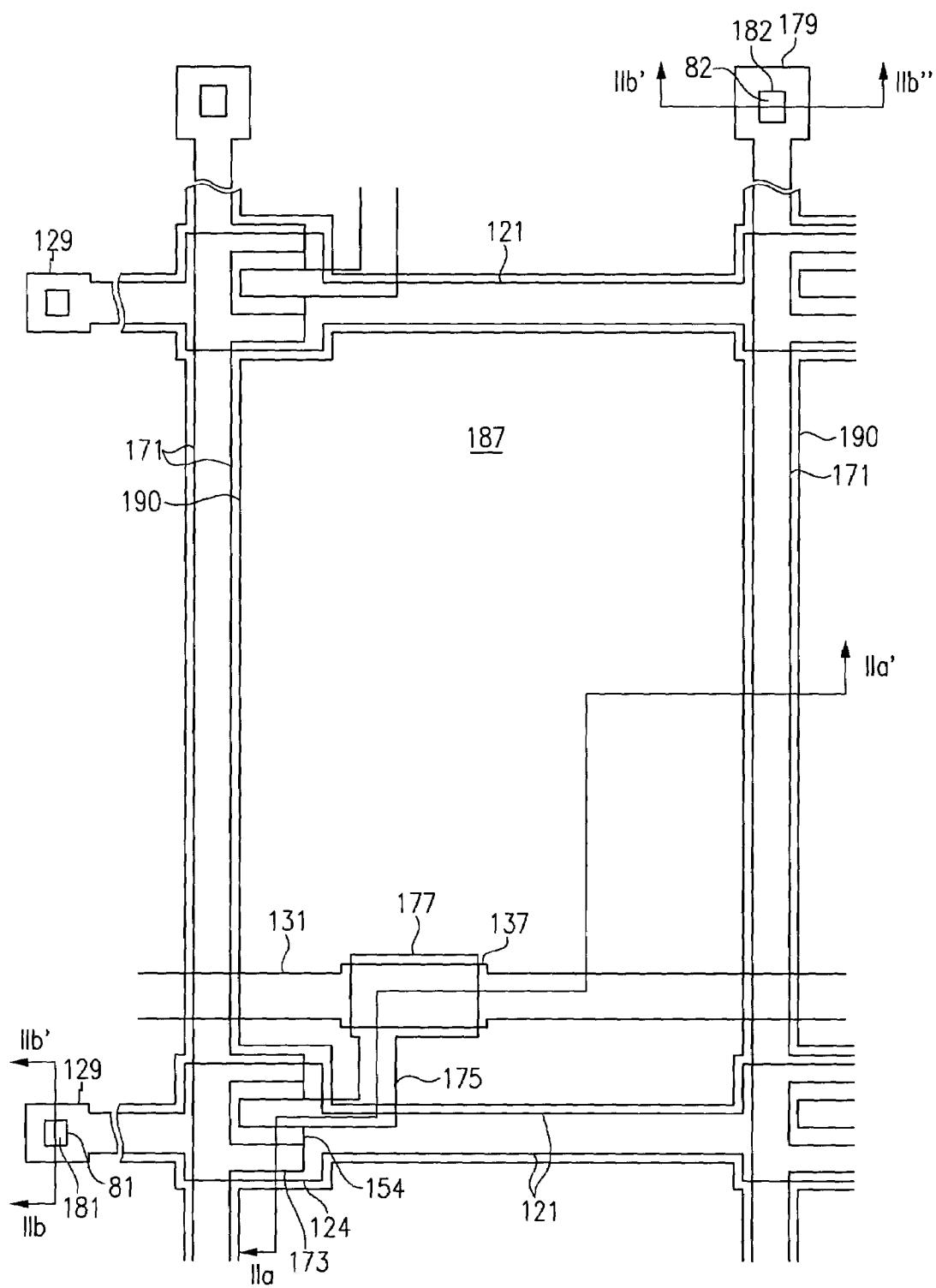
FIG. 1 is a layout view of a lower panel of a TFT array panel according to an exemplary embodiment of the present invention.

The present invention will be described more fully hereinafter with reference to the accompanying drawings, in which exemplary embodiments of the invention are shown. This invention may, however, be embodied in many different forms and should not be construed as limited to the embodiments set forth herein. Like numerals refer to like elements throughout.

In the drawings, the thickness of layers and regions are exaggerated for clarity. It will be understood that when an element such as a layer, region, or substrate is referred to as being "on" another element, it can be directly on the other element or intervening elements may also be present. In contrast, when an element is referred to as being "directly on" another element, there are no intervening elements present.

TFTs and manufacturing methods thereof according to embodiments of the present invention will now be described with reference to the accompanying drawings.

A TFT array panel according to an embodiment of the present invention will be described in detail with reference to FIGS. 1, 2A, and 2B.

Figure 2A:
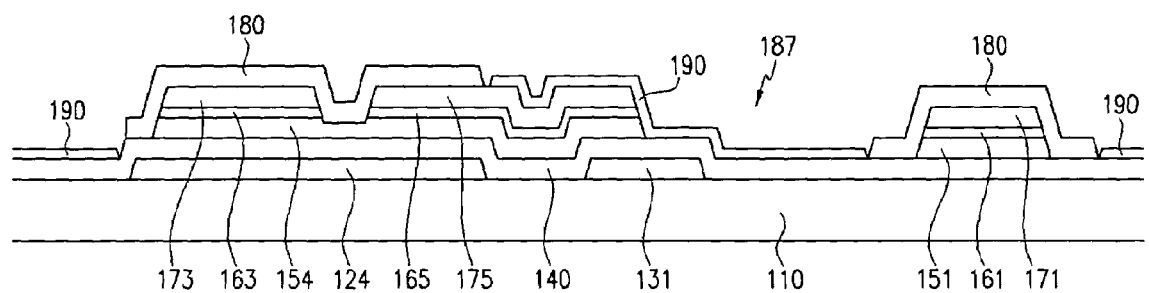
FIG. 2A is a sectional view of the TFT array panel shown in FIG. 1 taken along the line IIA-IIA'.
Figure 2B:
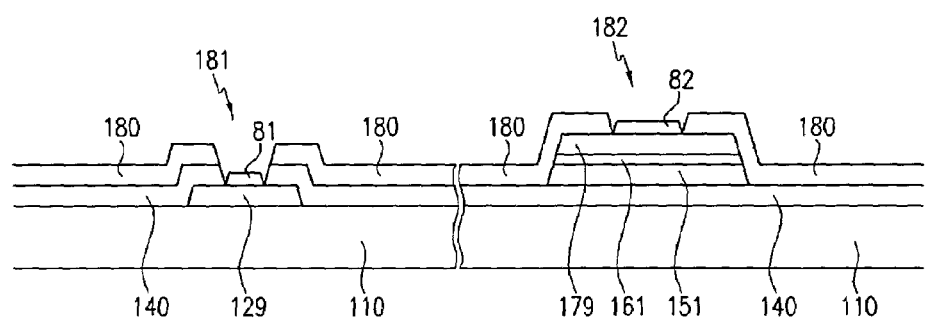
FIG. 2B is a sectional view of the TFT array panel shown in FIG. 1 taken along the lines IIB-IIB' and IIB'-IIB"

FIG. 1 is a layout view of a lower panel of a TFT array panel according to an embodiment of the present invention, FIG. 2A is a sectional view of the TFT array panel shown in FIG. 1 taken along the line IIA-IIA', and FIG. 2B is a sectional view of the TFT array panel shown in FIG. 1 taken along the lines IIB-IIB' and IIB'-IIB".

As shown in FIGS. 1, 2A and 2B, a plurality of gate lines 121 and a plurality of storage electrode lines 131 are formed on an insulating substrate 110 such as transparent glass.

The gate lines 121 extend substantially in a transverse direction and transmit gate signals. Each gate line 121 includes a plurality of gate electrodes 124 projecting in upward and downward directions. Each gate line 121 further includes an end portion 129 having a large area for contact with another layer or a driving circuit. The gate lines 121 may also extend to be connected to a driving circuit that may be integrated on the lower panel of the TFT array panel.

The storage electrode lines 131 extend substantially parallel to the gate lines 121 and are supplied with a predetermined voltage such as a common voltage, which is applied to a common electrode (not shown) on a common electrode panel (not shown). Each storage electrode line 131 includes a plurality of expansions 137 projecting in upward and downward directions.

The gate lines 121 and the storage electrode lines 131 are preferably made of an Al-containing metal such as Al and an Al alloy, an Ag-containing metal such as Ag and an Ag alloy, a Cu-containing metal such as Cu and a Cu alloy, a Mo-containing metal such as Mo and a Mo alloy, Cr, Ti, or Ta. The gate lines 121 may have a multi-layered structure including two films having different physical characteristics.

One of the two films is preferably made of a low resistivity metal including an Al-containing metal, an Ag-containing metal, and a Cu-containing metal for reducing a signal delay or voltage drop in the gate lines 121. The other film is preferably made of a material such as a Mo-containing metal, Cr, Ta, or Ti, which has good physical, chemical, and electrical contact characteristics when combined with other materials such as indium tin oxide (ITO) and indium zinc oxide (IZO). Exemplary combinations of the two films include a lower Cr film and an upper Al (alloy) film, and a lower Al (alloy) film and an upper Mo (alloy) film, among others. It is to be understood to one of ordinary skill in the art, that the lower and upper films may be made of various metals or conductors.

The lateral sides of the gate lines 121 and the storage electrode lines 131 are inclined relative to a surface of the substrate 110, and the inclination angle thereof ranges from about 30-80 degrees. A gate insulating layer 140 preferably made of silicon nitride (SiNx) is formed on the gate lines 121 and the storage electrode lines 131.

A plurality of semiconductor stripes 151 are preferably made of hydrogenated amorphous silicon (a-Si) or polysilicon and are formed on the gate insulating layer 140. Each semiconductor stripe 151 extends substantially in the longitudinal direction and has a plurality of projections 154 branching out toward the gate electrodes 124.

A plurality of ohmic contact stripes and islands 161 and 165 preferably made of silicide or n+ hydrogenated a-Si are heavily doped with N-type impurities such as phosphorous and are formed on the semiconductor stripes 151. Each ohmic contact stripe 161 has a plurality of projections 163, and the projections 163 and the ohmic contact islands 165 are located in pairs on the projections 154 of the semiconductor stripes 151.

The lateral sides of the semiconductor stripes 151 and the ohmic contacts 161 and 165 are inclined relative to a surface of the substrate 110, and the inclination angles thereof are preferably in a range from about 30-80 degrees.

A plurality of data lines 171 and a plurality of drain electrodes 175, which are separated from the data lines 171, are formed on the ohmic contacts 161 and 165.

The data lines 171 extend substantially in the longitudinal direction to transmit data voltages, and they intersect the gate lines 121. Each data line 171 includes an end portion 179 having a large area for contact with another layer or an external device, and a plurality of source electrodes 173 projecting toward the gate electrodes 124.

Each drain electrode 175 has a wide end portion 177 and a linear end portion. The wide end portion 177 has a large area for contact with the expansions 137 of the storage electrode line 131, and the linear end portion is partly enclosed by a source electrode 173 that is curved.

A gate electrode 124, a source electrode 173, and a drain electrode 175 along with a projection 154 of a semiconductor stripe 151 form a TFT having a channel formed in the projection 154 disposed between the source electrode 173 and the drain electrode 175.

The data lines 171 and the drain electrodes 175 are preferably made of a refractory metal such as Cr, Mo, Ti, Ta, or alloys thereof. However, they may have a multi-layered structure including a refractory metal film (not shown) and a low resistivity film (not shown). Examples of the multi-layered structures include a double-layered structure including a lower Cr/Mo (alloy) film and an upper Al (alloy) film, and a triple-layered structure including a lower Mo (alloy) film, an intermediate Al (alloy) film, and an upper Mo (alloy) film.

Similar to the gate lines 121, the data lines 171 and the drain electrodes 175 have inclined edge profiles, and the inclination angles thereof range from about 30-80 degrees.

The ohmic contacts 161 and 165 are interposed only between the underlying semiconductor stripes 151 and the overlying conductors 171 and 175 thereon. This configuration reduces the contact resistance between the semiconductor stripes 151 and the conductors 171 and 175. The semiconductor stripes 151 have planar shapes similar to the data lines 171 and the drain electrodes 175 as well as the underlying ohmic contacts 161 and 165. However, the projections 154 of the semiconductor stripes 151 include some exposed portions which are not covered by the data lines 171 and the drain electrodes 175. Some exposed portions are located between the source electrodes 173 and the drain electrodes 175. Alternatively, only the projections 154 may be left to form contact islands without using other portions of the semiconductor stripes 151.

As further shown in FIGS. 1, 2A and 2B, a passivation layer 180 is formed on the data lines 171, the drain electrodes 175, and the exposed portions of the semiconductor stripes 151. The passivation layer 180 is preferably made of an inorganic insulator such as silicon nitride or silicon oxide, a photosensitive organic material having a good flatness characteristic, or a low dielectric insulating material having a dielectric constant lower than 4.0 such as a-Si:C:O and a-Si:O:F formed by plasma enhanced chemical vapor deposition (PECVD).

The passivation layer 180 may have a double-layered structure including a lower inorganic film and an upper organic film so that it may take advantage of the characteristics of the organic film, and protect the exposed portions of the semiconductor stripes 151.

The passivation layer 180 has a plurality of contact holes 182 and a plurality of openings 187 exposing parts of the end portions 179 of the data lines 171 and parts enclosed by the gate lines 121 and the date lines 171, respectively. The passivation layer 180 and the gate insulating layer 140 have a plurality of contact holes 181 exposing parts of the end portions 129 of the gate lines 121. The openings 187 expose at least a part of the drain electrodes 175 and the gate insulation layer 140.

A plurality of pixel electrodes 190 are formed in the openings 187, and a plurality of contact assistants 81 and 82 are formed in the contact holes 181 and 182. The pixel electrodes 190 and the contact assistants 81 and 82 are preferably made of a transparent conductor such as ITO or IZO, or a reflective conductor such as Ag or Al. When the pixel electrodes 190 are formed in the openings 187 and the contact assistants 81 and 82 are formed in the contact holes 181 and 182, the borders of the pixel electrodes 190 and the contact assistants 81 and 82 are substantially equal to the border of the passivation layer 180.

The pixel electrodes 190 are physically and electrically connected to the drain electrodes 175, which are exposed through the openings 187, such that the pixel electrodes 190 receive the data voltages from the drain electrodes 175. The pixel electrodes 190 are supplied with the data voltages that generate electric fields in cooperation with a common electrode (not shown) supplied with a common voltage for determining the orientations of liquid crystal molecules (not shown) disposed between one of the pixel electrodes 190 and the common electrode or yield currents in a light emitting layer (not shown) to emit light.

Regarding an LCD, a pixel electrode 190 and a common electrode form a capacitor called a "liquid crystal capacitor," which stores applied voltages after turning-off of the TFT. An additional capacitor called a "storage capacitor," which is connected in parallel to the liquid crystal capacitor, is provided for enhancing the voltage storing capacity of the liquid crystal capacitor. The storage capacitor is implemented by overlapping the pixel electrodes 190 with the storage electrode lines 131 and the drain electrodes 175 connected to the pixel electrodes 190 with the storage electrode lines 131.

Since the expansions 137 of the storage electrode lines 131 overlap the wide end portions 177 of the drain electrodes 175, and only the gate insulating layer 140 without the passivation layer 180 remains between the pixel electrodes 190 and the storage electrode lines 131, the distance between the pixel electrodes 190 and the storage electrode lines 131 is decreases, thus the capacitance of the storage capacitors is large.

When the gate insulating layer 140 without the passivation layer 180 remains between the pixel electrodes 190 and the storage electrode lines 131, the expansions 177 of the drain electrodes 175 connected to the pixel electrodes 190 overlap the storage electrode lines 131 across the gate insulating layer 140.

The contact assistants 81 and 82 have edges that are substantially similar to the edges of the contact holes 181 and 182, and they are connected to and cover the exposed parts of the end portions 129 of the gate lines 121 and the exposed parts of the end portions 179 of the data lines 171 through the contact holes 181 and 182, respectively. The contact assistants 81 and 82 protect the end portions 129 and 179 and complement the adhesion of the end portions 129 and 179 and external devices.

Now, a method of manufacturing the TFT array panel shown in FIGS. 1-2B will be described in detail with reference to FIGS. 3-11B.

Figure 3:
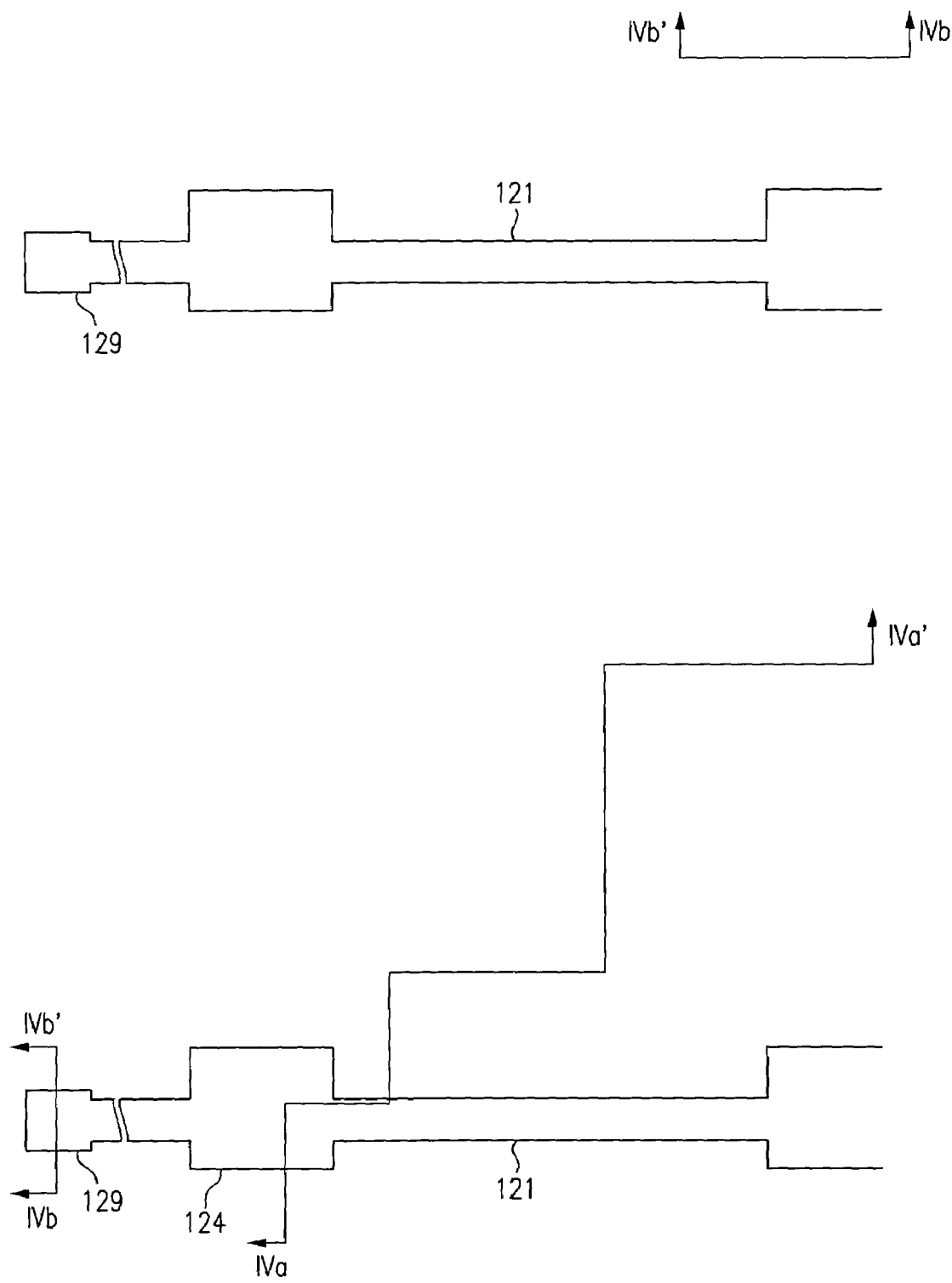
FIGS. 3, 6, and 9 are layout views of the TFT array panel shown in FIGS. 1-2B during intermediate manufacturing steps thereof according to an exemplary embodiment of the present invention.
Figure 4A:
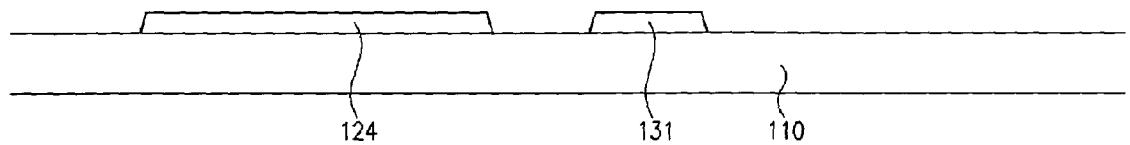
FIG. 4A is a sectional view of the TFT array panel shown in FIG. 3 taken along the line IVA-IVA'.

FIG. 3 is a layout view of the TFT array panel shown in FIGS. 1, 2A and 2B during intermediate manufacturing steps according to an embodiment of the present invention. FIG. 4A is a sectional view of the TFT array panel shown in FIG. 3 taken along the line IVA-IVA' and FIG. 4B is a sectional view of the TFT array panel shown in FIG. 3 taken along the lines IVB-IVB' and IVB'-IVB".

Figure 4B:
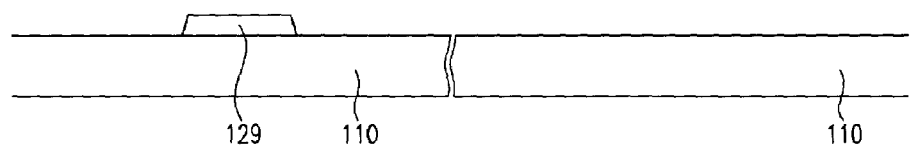
FIG. 4B is a sectional view of the TFT array panel shown in FIG. 3 taken along the lines IVB-IVB' and IVB'-IVB"

Referring to FIGS. 3, 4A, and 4B, a conductive layer preferably made of metal is deposited by performing a sputtering process, etc., on an insulating substrate 110 preferably made of a transparent glass. The conductive layer may have a thickness of about 1500-5000 Å. The conductive layer is then subjected to lithography and etching to form a plurality of gate lines 121 including gate electrodes 124 and an end portion 129, and a plurality of storage electrode lines 131 including expansions 137.

Figure 5A:
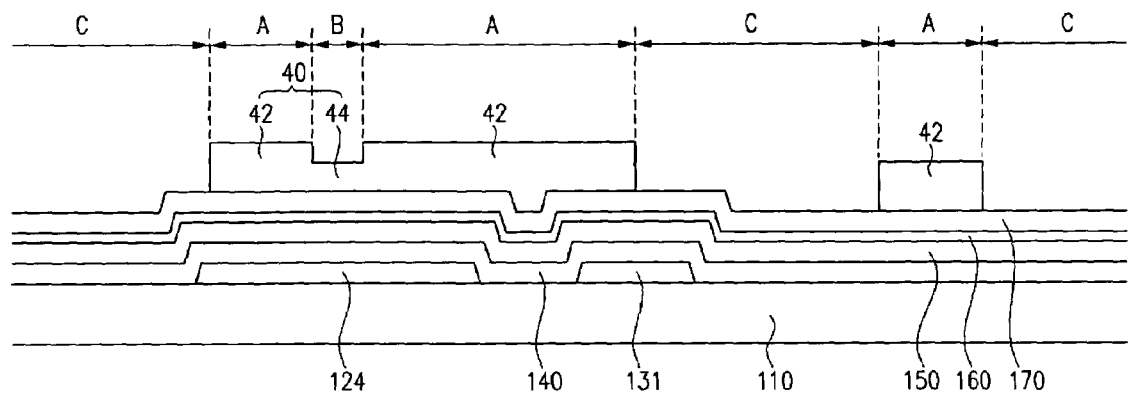
FIG. 5A is a sectional view of the TFT array panel shown in FIG. 3 taken along the line IVA-IVA' and FIG. 5B is a sectional view of the TFT array panel shown in FIG. 3 taken along the lines IVB-IVB' and IVB'-IVB"
Figure 5B:
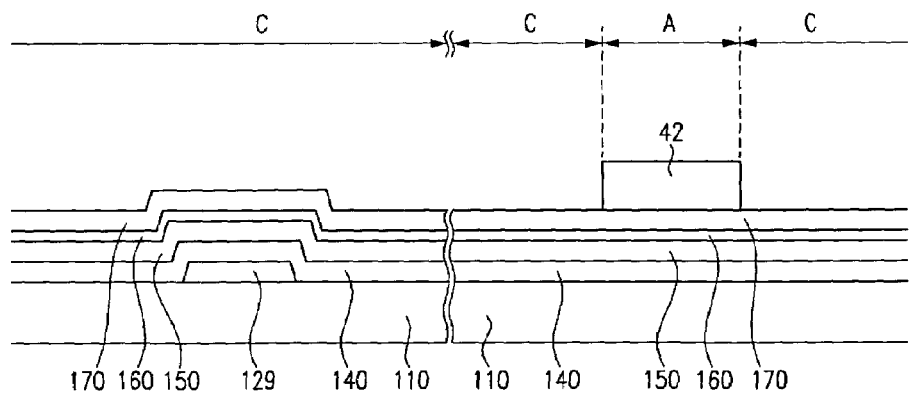

FIG. 5A is a sectional view of the TFT array panel shown in FIG. 3 taken along the line IVA-IVA' and FIG. 5B is a sectional view of the TFT array panel shown in FIG. 3 taken along the lines IVB-IVB' and IVB'-IVB". The sectional views of FIGS. 5A and 5B illustrate the step following the step shown in FIGS. 4A and 4B.

Referring to FIGS. 5A and 5B, a gate insulating layer 140, an intrinsic a-Si layer 150, and an extrinsic a-Si layer 160 are sequentially deposited by CVD. The gate insulating layer 140 is preferably made of silicon nitride and has a thickness of about 2000-5000 Å. The deposition temperature of the gate insulating layer 140 is preferably in a range from about 250-450° C.

A conductive layer 170 preferably made of metal is then deposited by performing a sputtering process, etc., and a photoresist film 40 with a thickness of about 1-2 microns is coated on the conductive layer 170.

The photoresist film 40 is exposed to light through a photomask (not shown), and developed such that the photoresist has a position-dependent thickness. The photoresist shown in FIGS. 5A and 5B includes a plurality of first to third portions in order of decreasing thickness. The first portions located on wire areas A and the second portions located on channel areas B are indicated by reference numerals 42 and 44, respectively. No reference numeral is assigned to the third portions located on remaining areas C since they have a substantially zero thickness so that underlying portions of the conductive layer 170 can be exposed. The thickness ratio of the second portions 44 to the first portions 42 is adjusted depending upon the conditions in a subsequent process steps. It is preferable that the thickness of the second portions 44 is equal to or less than half of the thickness of the first portions 42, and in particular, equal to or less than 4000 Å.

The position-dependent thickness of the photoresist is obtained by several techniques, which include for example, providing translucent areas on the exposure mask as well as by providing light transmitting areas and light blocking opaque areas on the exposure mask. The translucent areas may have a slit pattern, a lattice pattern, or have a thin film or films with intermediate transmittances or thickness. When using a slit pattern, it is preferable that the width of the slits or the distance between the slits is smaller than the resolution of a light exposer used for the photolithography. As another example, a reflowable photoresist may be used. For example, when a photoresist pattern made of a reflowable material is formed by using a normal exposure mask with only transparent areas and opaque areas, it is subject to a reflow process where the reflowable material flows onto areas not including the photoresist, thereby forming thin portions of photoresist.

The different thicknesses of the photoresist portions 42 and 44 enable selective etching of underlying layers when undergoing certain processes. Therefore, a plurality of data lines 171 including source electrodes 173 and end portions 179, a plurality of drain electrodes 175 and wide end portions 177, as well as a plurality of ohmic contact stripes 161 including projections 163, a plurality of ohmic contact islands 165, and a plurality of semiconductor stripes 151 including projections 154 may be obtained as shown in FIGS. 6, 7A, and 7B by performing a series of etching steps.

Figure 6:
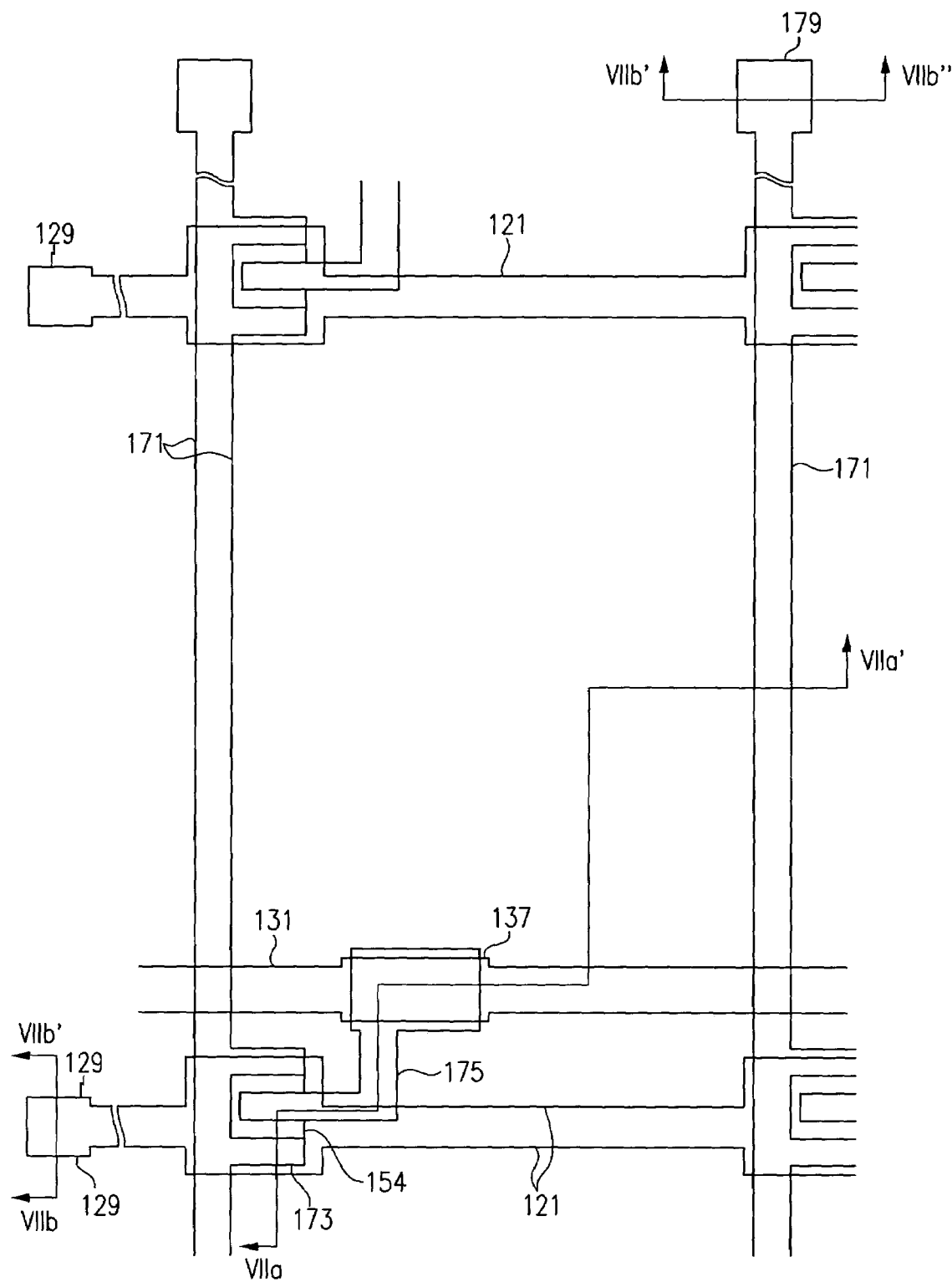
Figure 7A:
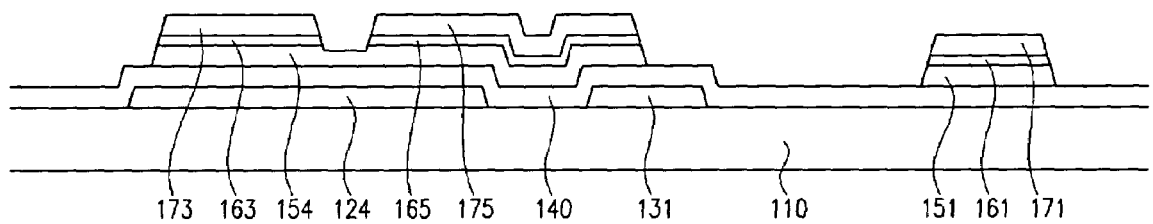
FIG. 7A is a sectional view of the TFT array panel shown in FIG. 6 taken along the line VIIA-VIIA'.
Figure 7B:
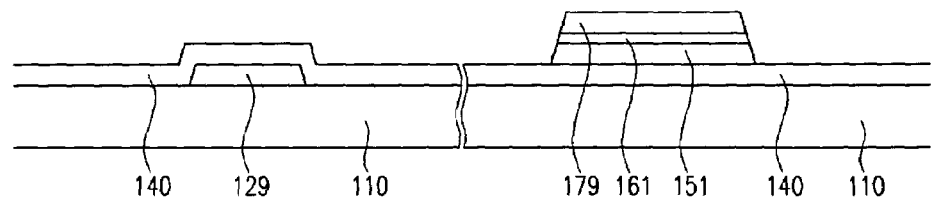
FIG. 7B is a sectional view of the TFT array panel shown in FIG. 6 taken along the lines VIIB-VIIB' and VIIB'-VIIB".

As shown, FIG. 6 is a layout view of the TFT array panel shown in FIGS. 1, 2A and 2B during intermediate manufacturing steps according to an embodiment of the present invention. FIG. 7A is a sectional view of the TFT array panel shown in FIG. 6 taken along the line VIIA-VIIA' and FIG. 7B is a sectional view of the TFT array panel shown in FIG. 6 taken along the lines VIIB-VIIB' and VIIB'-VIIB".

For descriptive purposes, portions of the conductive layer 170, the extrinsic a-Si layer 160, and the intrinsic a-Si layer 150 on the wire areas A (of FIGS. 5A and 5C) are referred to as first portions, portions of the conductive layer 170, the extrinsic a-Si layer 160, and the intrinsic a-Si layer 150 on the channel areas B (of FIG. 5A) are referred to as second portions, and portions of the conductive layer 170, the extrinsic a-Si layer 160, and the intrinsic a-Si layer 150 on the remaining areas C (of FIGS. 5A and 5B) are referred to as third portions.

An exemplary sequence of forming the TFT array panel of FIG. 6 is as follows:

(1) Remove the third portions of the conductive layer 170, the extrinsic a-Si layer 160, and the intrinsic a-Si layer 150 on the wire areas A;

(2) Remove the second portions 44 of the photoresist;

(3) Remove the second portions of the conductive layer 170 and the extrinsic a-Si layer 160 on the channel areas B; and (4) Remove the first portions 42 of the photoresist.

Another exemplary sequence of forming the TFT array panel of FIG. 6 is as follows:

(1) Remove the third portions of the conductive layer 170;

(2) Remove the second portions 44 of the photoresist;

(3) Remove the third portions of the extrinsic a-Si layer 160 and the intrinsic a-Si layer 150;

(4) Remove the second portions of the conductive layer 170;

(5) Remove the first portions 42 of the photoresist; and (6) Remove the second portions of the extrinsic a-Si layer 160.

The removal of the second portions 44 of the photoresist is performed either simultaneously with or independent from the removal of the third portions of the extrinsic a-Si layer 160 and of the intrinsic a-Si layer 150. Similarly, the removal of the first portions 42 of the photoresist is performed either simultaneously with or independent from the removal of the second portions of the extrinsic a-Si layer 160. For example, a gas mixture of $SF_6$ and HCl or $SF_6$ and $O_2$ may be used to etch the photoresist and the a-Si layers 150 and 160 with substantially equal etch ratios when removing the first portions 42 of the photoresist.

Residue of the photoresist left on the surface of the conductive layer 170 may be removed by performing an ashing process, etc.

Figure 8A:
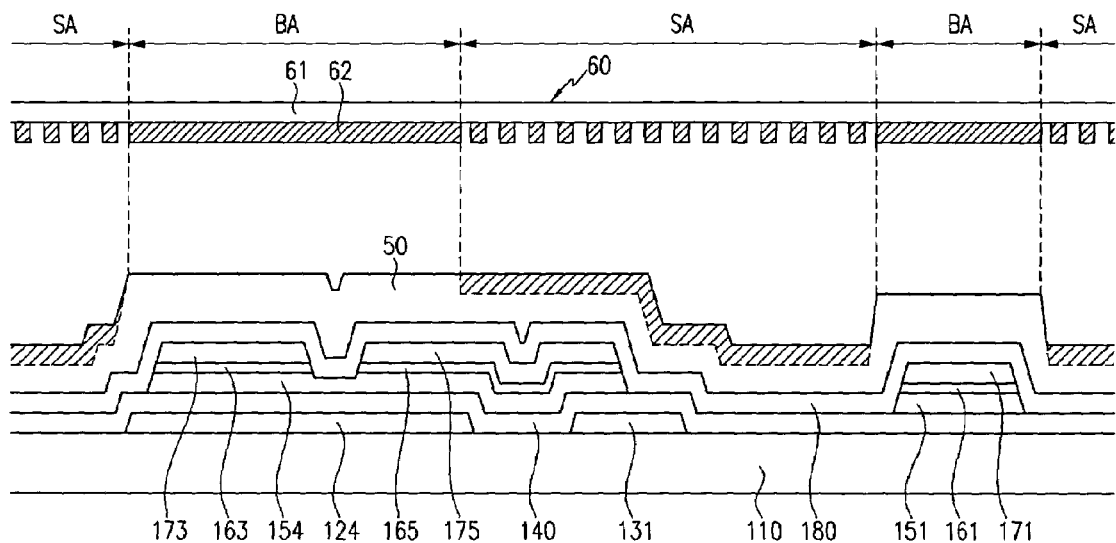
FIG. 8A is a sectional view of the TFT array panel shown in FIG. 6 taken along the line VIIA-VIIA' and FIG. 8B is a sectional view of the TFT array panel shown in FIG. 6 taken along the lines VIIB-VIIB' and VIIB'-VIIB"
Figure 8B:
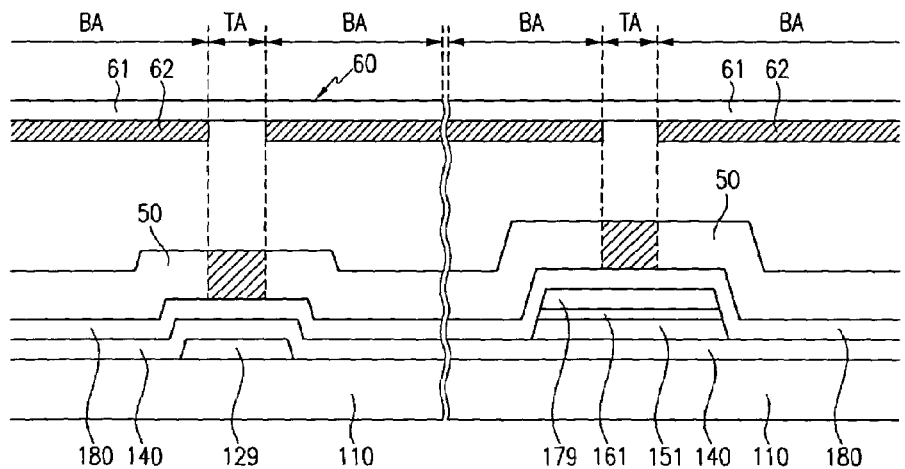

FIG. 8A is a sectional view of the TFT array panel shown in FIG. 6 taken along the line VIIA-VIIA' and FIG. 8B is a sectional view of the TFT array panel shown in FIG. 6 taken along the lines VIIB-VIIB' and VIIB'-VIIB". The sectional views of FIGS. 8A and 8B illustrate the step following the step shown in FIGS. 7A and 7B.

Referring to FIGS. 8A and 8B, a passivation layer 180 is deposited and a positive photoresist film 50 is coated. Thereafter, a photomask 60 is aligned with the substrate 110.

The photomask 60 includes a transparent substrate 61 and an opaque light blocking film 62, and it is divided into light transmitting areas TA, light blocking areas BA, and translucent areas SA. The light blocking film 62 is not disposed on the light transmitting areas TA, but it is disposed on the light blocking areas BA and the translucent areas SA. The light blocking film 62 is a wide area having a width larger than a predetermined value of the light blocking areas BA, and it includes a plurality of areas having widths or distances smaller than a predetermined value to form slits. The translucent areas SA face the areas enclosed by the gate lines 121 and the data lines 171, the light transmitting areas TA face the end portions 129 of the gate lines 121 and the end portions 179 of the data lines 171, and the light blocking areas BA face remaining portions 52 and 54 of the photoresist 50.

The photoresist 50 is exposed to light through the photomask 60, and it is developed such that portions of the photoresist 50 that receive a predetermined amount of light are removed. Referring to FIGS. 8A and 8B, portions of the photoresist 50 facing the light transmitting areas TA are removed, portions of the photoresist 50 facing the translucent areas SA have reduced thicknesses, and portions of the photoresist 50 facing the light blocking areas BA remain. In FIGS. 8A and 8B, the hatched portions indicate the portions of the photoresist 50 that have been removed after development.

Figure 9:
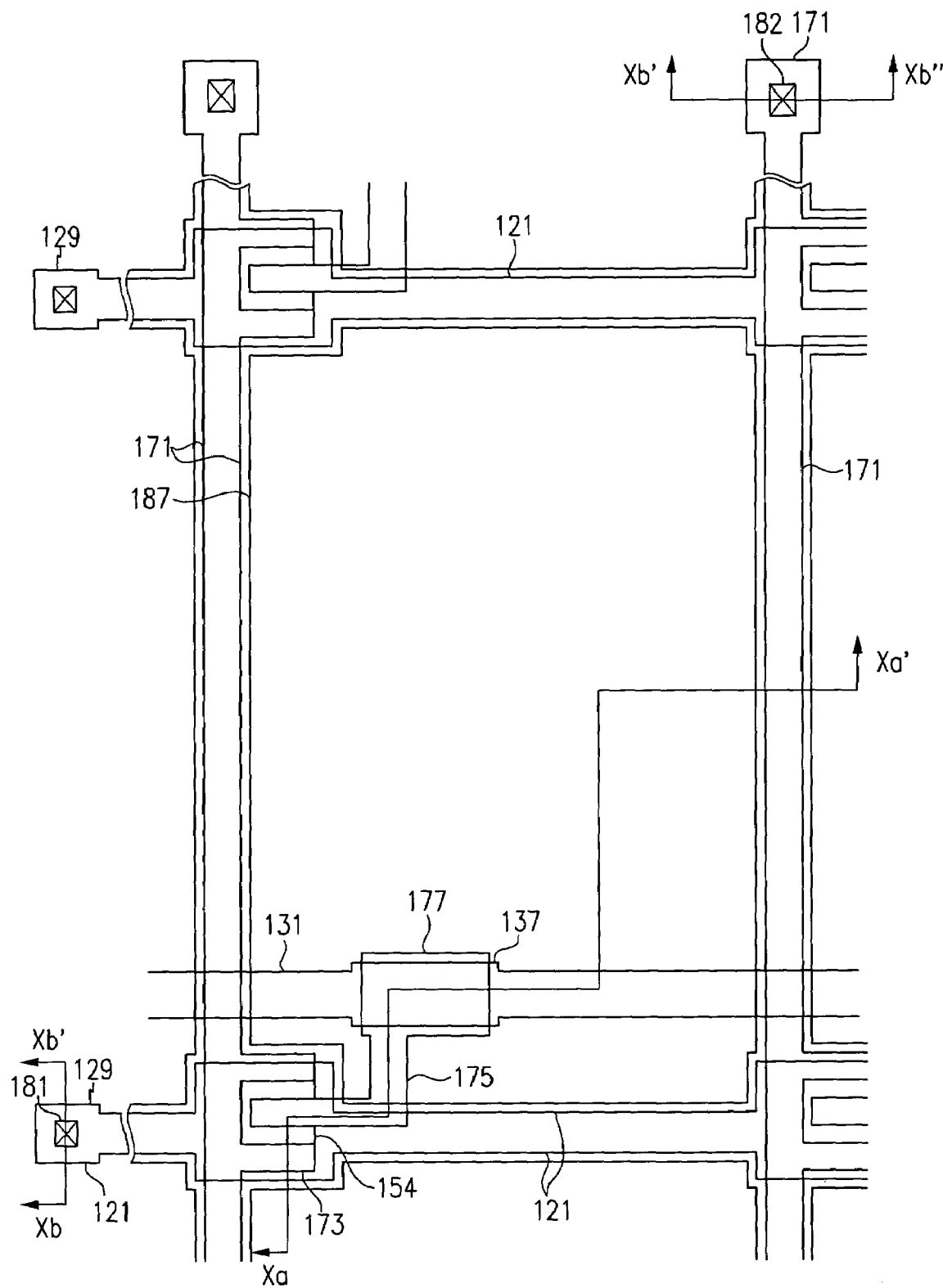
Figure 10A:
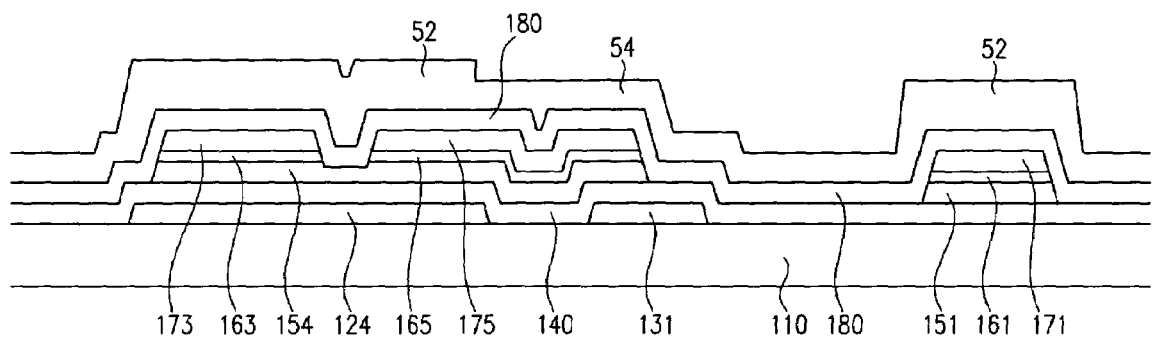
FIG. 10A is a sectional view of the TFT array panel shown in FIG. 9 taken along the line XA-XA'.

FIG. 9 is a layout view of the TFT array panel shown in FIGS. 1, 2A and 2B during intermediate manufacturing steps according to an embodiment of the present invention. FIG. 10A is a sectional view of the TFT array panel shown in FIG. 9 taken along the line XA-XA' and FIG. 10B is a sectional view of the TFT array panel shown in FIG. 9 taken along the lines XB-XB' and XB'-XB".

Figure 10B:
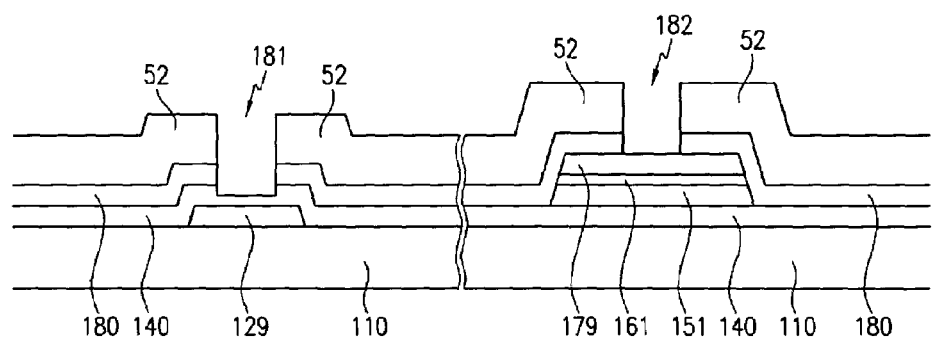
FIG. 10B is a sectional view of the TFT array panel shown in FIG. 9 taken along the lines XB-XB' and XB'-XB"

Referring to FIGS. 9, 10A, and 10B, the passivation layer 180 is etched using the remaining portions 52 and 54 of the photoresist 50 as an etch mask to form upper side walls of a plurality of contact holes 181 exposing the end portions 129 of the gate lines 121 and a plurality of contact holes 182 exposing the end portions 179 of the data lines 171, respectively. When the passivation layer 180 is etched using the remaining portions 52 and 54 of the photoresist 50 as an etch mask, as shown in FIG. 10B, since portions of the gate insulating layer 140 are etched along with the passivation layer 180, the gate insulating layer 140 may have a reduced thickness.

Figure 11A:
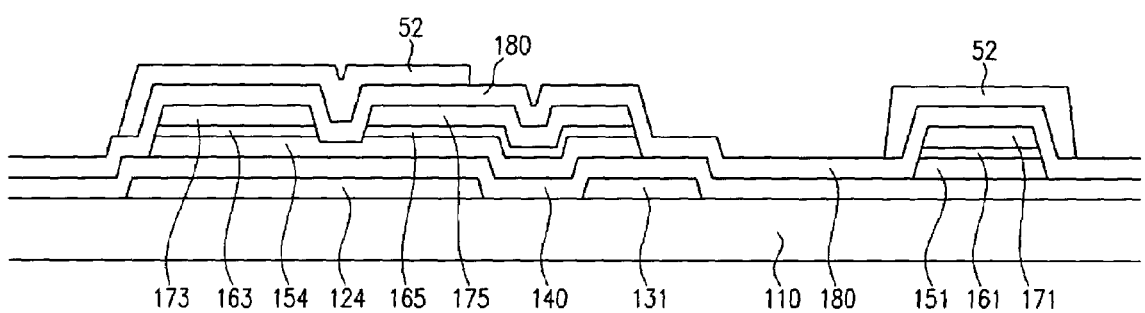
FIG. 11A is a sectional view of the TFT array panel shown in FIG. 9 taken along the line XA-XA' and FIG. 11B is a sectional view of the TFT array panel shown in FIG. 9 taken along the lines XB-XB' and XB'-XB"
Figure 11B:
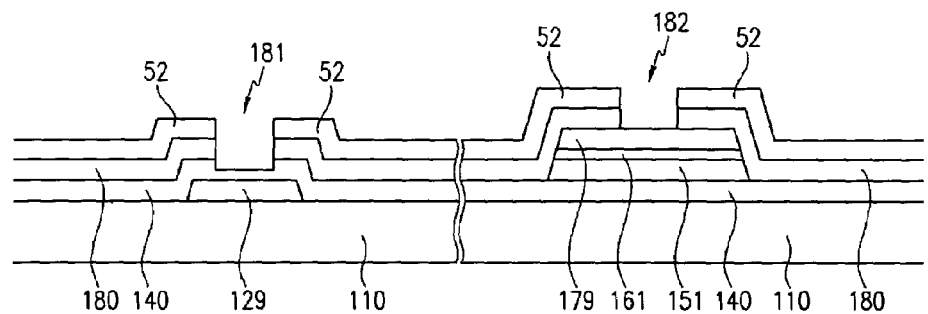

FIG. 11A is a sectional view of the TFT array panel shown in FIG. 9 taken along the line XA-XA' and FIG. 11B is a sectional view of the TFT array panel shown in FIG. 9 taken along the lines XB-XB' and XB'-XB". The sectional views of FIGS. 11A and 11B illustrate the step following the step shown in FIGS. 10A and 10B.

Referring to FIGS. 11A and 11B, the remaining thin portions 54 of the photoresist 50 are removed by performing an ashing process, etc., and the thickness of the remaining thick portions 52 is decreased.

Figure 12A:
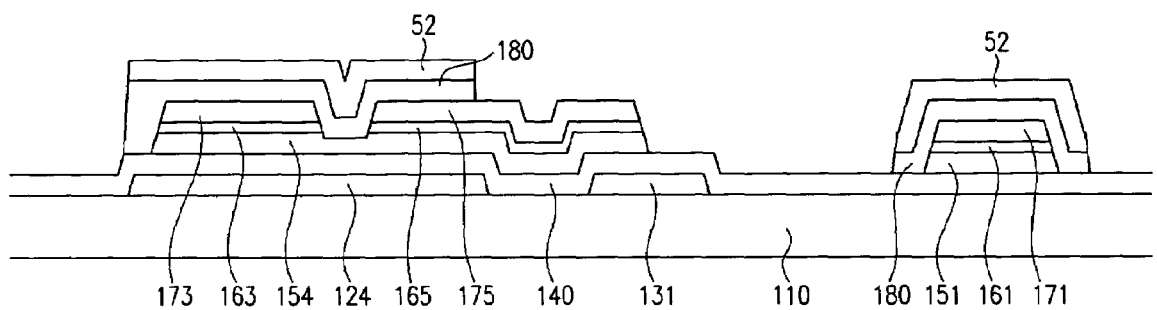
FIG. 12A is a sectional view of the TFT array panel shown in FIG. 9 taken along the line XA-XA' and FIG. 12B is a sectional view of the TFT array panel shown in FIG. 9 taken along the lines XB-XB' and XB'-XB"
Figure 12B:
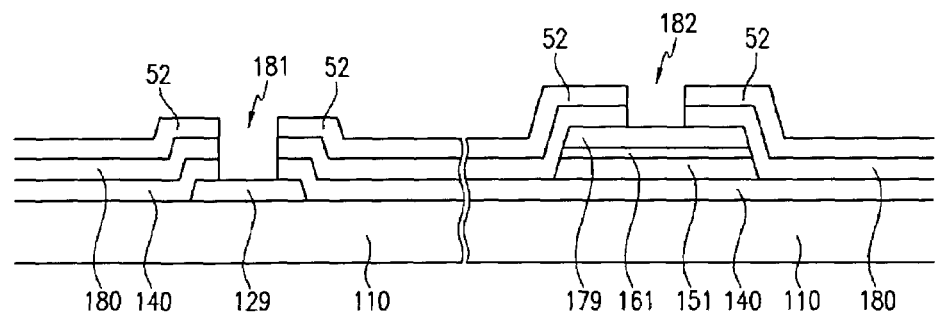

FIG. 12A is a sectional view of the TFT array panel shown in FIG. 9 taken along the line XA-XA' and FIG. 12B is a sectional view of the TFT array panel shown in FIG. 9 taken along the lines XB-XB' and XB'-XB". The sectional views of FIGS. 12A and 12B illustrate the step following the step shown in FIGS. 11A and 11B.

Referring to FIGS. 12A and 12B, the passivation layer 180 and gate insulating layer 140 are etched using the remaining portions 52 of the photoresist 50 as an etch mask. As a result, the openings 187 expose portions of the gate insulating layer 140 in areas enclosed by the gate lines 121 and the data lines 171, and the contact holes 181 expose the end portions 129 of the gate lines 121. Thus, the gate insulating layer 140 remains in the openings 187 such that the storage electrode lines 131 are not exposed.

Figure 13A:
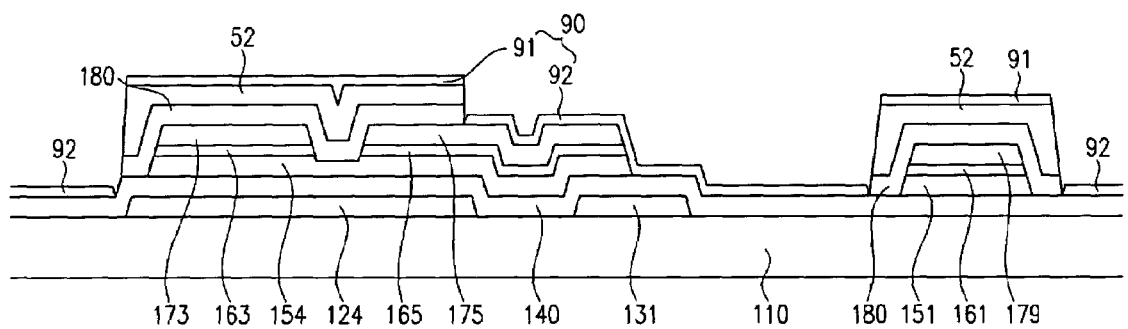
FIG. 13A is a sectional view of the TFT array panel shown in FIG. 9 taken along the line XA-XA' and FIG. 13B is a sectional view of the TFT array panel shown in FIG. 9 taken along the lines XB-XB' and XB'-XB".
Figure 13B:
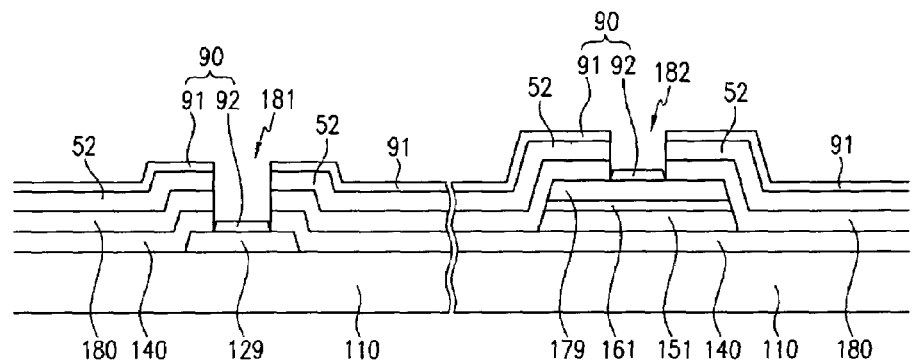

FIG. 13A is a sectional view of the TFT array panel shown in FIG. 9 taken along the line XA-XA' and FIG. 13B is a sectional view of the TFT array panel shown in FIG. 9 taken along the lines XB-XB' and XB'-XB". The sectional views of FIGS. 13A and 13B illustrate the step following the step shown in FIGS. 12A and 12B.

Referring to FIGS. 13A and 13B, a conductive film 90 preferably made of IZO, ITO, or amorphous ITO is deposited by performing a sputtering process, etc.

The conductive film 90 includes first portions 91 disposed on the photoresist 52 and remaining second portions 92. Since the height difference between the surface and the bottom of the photoresist 52 is large due to the thickness of the photoresist 52, the first portions 91 and the second portions 92 of the conductive film 90 are separated from each other at least in part to form gaps therebetween, and lateral sides of the photoresist 52 are exposed at least in part.

The substrate 110 is then dipped into a developer such that the developer infiltrates into the photoresist 52 through the exposed lateral sides of the photoresist 52 to remove the photoresist 52. At this time, the first portions 91 of the conductive film 90 disposed on the photoresist 52 come off along with the photoresist 52. This process is referred to as "lift-off." As a result, only the second portions 92 of the conductive film 90 are left to form a plurality of pixel electrodes 190 and a plurality of contact assistants 81 and 82 as shown in FIGS. 1, 2A, and 2B.

According to the method of manufacturing the TFT array panel according to an embodiment of the present invention, since the passivation layer 180 between the pixel electrodes 190 and the storage electrode lines 131 is removed and only the gate insulating layer 140 remains therebetween, distances between the pixel electrodes 190 and the storage electrode lines 131 are short and the capacitance of the storage capacitors is large. Thus, as the size of the storage electrode lines 131 decreases, the aperture ratio of a pixel increases. In addition, since portions of the gate insulating layer 140 in the openings 187 remain to enable formation of the storage electrode lines 131 under the gate insulating layer 140, the storage capacitors are formed by overlapping the storage electrode lines 131 and the pixel electrode 190.

Moreover, since the method of manufacturing the TFT array panel according to an embodiment of the present invention simultaneously forms the data lines 171, the drain electrodes 175, the semiconductor stripes 151, and the ohmic contacts 161 and 165 using a lithography step, an additional lithography step for forming the pixel electrodes 190 and the contact assistants 81 and 82 is not required. Thus, the manufacturing process is shortened thereby reducing the time and cost associated with manufacturing a TFT array panel.

The TFT array panel of the present invention can be employed with a number of display devices such as LCDs and OLEDs. For example, when used with an OLED display device, each pixel of the OLED may include at least two thin film transistors including a first thin film transistor connected to gate lines and data lines and a second thin film transistor connected to pixel electrodes. In addition, each pixel may include an organic light emitting member disposed between the pixel electrode and common electrode.

While the present invention has been shown and described with reference to exemplary embodiments thereof, it will be understood by those of ordinary skill in the art that various changes in form and details may be made therein without departing from the spirit and scope of the present invention as defined by the following claims.

What is claimed is:

1. A method of manufacturing a thin film transistor array panel, the method comprising:

forming a gate line and a storage electrode line on a substrate;

forming a gate insulating layer on the gate line and the storage electrode line;

forming a semiconductor layer on the gate insulating layer;

forming an ohmic contact layer on the semiconductor layer;

forming a data line and a drain electrode on the ohmic contact layer;

depositing a passivation layer on the data line and the drain electrode;

forming a first photoresist including a first portion and a second portion on the passivation layer, wherein the second portion of the first photoresist overlaps a portion of the drain electrode, a portion of the storage electrode line and a pixel area;

etching the passivation layer using the first photoresist to expose a portion of the data line and a first portion of the gate insulating layer overlapping a portion of the gate line;

removing the second portion of the first photoresist and reducing an initial thickness of the first portion of the first photoresist when the second portion of the first photoresist is removed;

etching the first portion of the gate insulating layer and the passivation layer using the first portion of the first photoresist having the reduced thickness to expose a second portion of the gate insulating layer, a portion of the drain electrode and a portion of the gate line;

depositing a conductive film on the first portion of the first photoresist having the reduced thickness and the second portion of the gate insulating layer; and removing the first portion of the first photoresist having the reduced thickness and the conductive film formed on the first portion of the first photoresist to form a pixel electrode on the pixel area, wherein the pixel electrode is connected to the exposed portion of the drain electrode and overlaps the portion of the storage electrode line with only the second portion of the gate insulating layer therebetween.

2. The method of claim 1, wherein the exposed portion of the data line and the exposed first portion of the gate insulating layer reduce the thickness of the first portion of the gate insulating layer.

3. The method of claim 1, wherein the first photoresist is formed by using a photomask including a light blocking area, a translucent area, and a light transmitting area.

4. The method of claim 1, wherein the step of removing the second portion of the first photoresist comprises:

performing an ashing process.

5. The method of claim 4, wherein the ashing process is performed to remove areas of the first photoresist corresponding to the translucent area of the photomask.

6. The method of claim 1, wherein the pixel electrode borders the gate insulating layer.

7. The method of claim 1, wherein the step of forming the pixel electrode comprises:

forming contact assistants on the exposed gate line and the exposed data line.

8. The method of claim 1, wherein the step of forming the semiconductor layer and the step of forming the data line and the drain line comprise:

depositing the gate insulating layer, an intrinsic a-Si layer, an extrinsic a-Si layer, and a conductive layer;

forming a second photoresist on the conductive layer; and etching the conductive layer, the extrinsic a-Si layer, and the intrinsic a-Si using the second photoresist to form the data line, the drain electrode, and the ohmic contact layer.

9. The method of claim 8, wherein the second photoresist is formed by using a photomask including a light blocking area, a translucent area, and a light transmitting area.

10. The method of claim 1, wherein the second portion of the first photoresist formed on the passivation layer is thinner than the first portion of the first photoresist formed on the passivation layer.

11. The method of claim 1, further comprising:

forming a storage capacitor between the storage electrode line and the pixel electrode.

* * * * *